(12) United States Patent
Yang et al.

(10) Patent No.: US 10,818,670 B2
(45) Date of Patent: Oct. 27, 2020

(54) MEMORY DEVICE AND METHOD FOR MANUFACTURING THE SAME

(71) Applicant: Winbond Electronics Corp., Taichung (TW)

(72) Inventors: Jiun-Sheng Yang, Taichung (TW); Noriaki Ikeda, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 16/542,954

(22) Filed: Aug. 16, 2019

(65) Prior Publication Data

US 2020/0058654 A1 Feb. 20, 2020

(30) Foreign Application Priority Data

Aug. 16, 2018 (TW) .............................. 107128604 A

(51) Int. Cl.
*H01L 27/10* (2006.01)
*H01L 27/108* (2006.01)

(52) U.S. Cl.
CPC .... *H01L 27/1085* (2013.01); *H01L 27/10805* (2013.01)

(58) Field of Classification Search
CPC ........... H01L 27/1085; H01L 27/10805; H01L 28/90; H01L 27/10814; H01L 27/10852
See application file for complete search history.

(56) References Cited

U.S. PATENT DOCUMENTS

| | | | |
|---|---|---|---|
| 6,759,703 B1 * | 7/2004 | Matsuhashi | H01L 28/60 257/306 |
| 7,273,781 B2 | 9/2007 | Lee | |
| 9,466,603 B2 * | 10/2016 | Yeom | H01L 21/31111 |
| 10,373,957 B2 * | 8/2019 | Chang | H01L 21/02592 |
| 10,658,365 B2 * | 5/2020 | Feng | H01L 27/10855 |
| 2014/0113431 A1 | 4/2014 | Song et al. | |

FOREIGN PATENT DOCUMENTS

| | | |
|---|---|---|
| TW | 200701405 A | 1/2007 |
| TW | 200727293 A | 7/2007 |
| TW | 201705372 A | 2/2017 |
| TW | 201820414 A | 6/2018 |

* cited by examiner

*Primary Examiner* — William Coleman
(74) *Attorney, Agent, or Firm* — Muncy, Geissler, Olds & Lowe, P.C.

(57) ABSTRACT

A memory device and a method for manufacturing the memory device are provided. The memory device includes an interlayer insulating layer formed on a substrate, a conductive contact plug formed in the interlayer insulating layer, a conductive barrier structure formed on the conductive contact plug, and a capacitor structure formed on the conductive barrier structure. The area of the top surface of the conductive contact plug is smaller than the area of the bottom surface of the conductive barrier structure, and the top surface of the conductive contact plug is completely covered by the bottom surface of the conductive barrier structure.

15 Claims, 5 Drawing Sheets

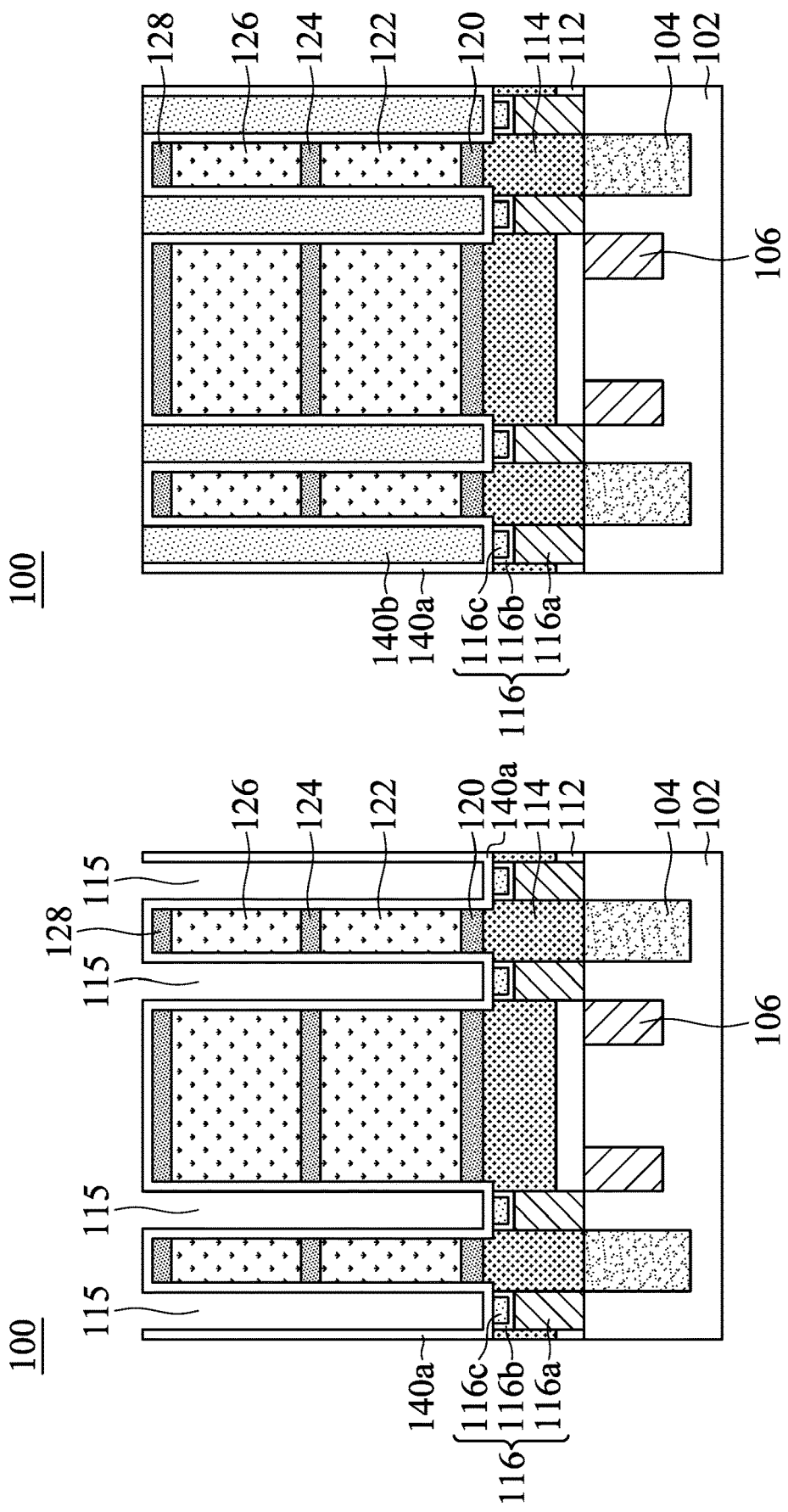

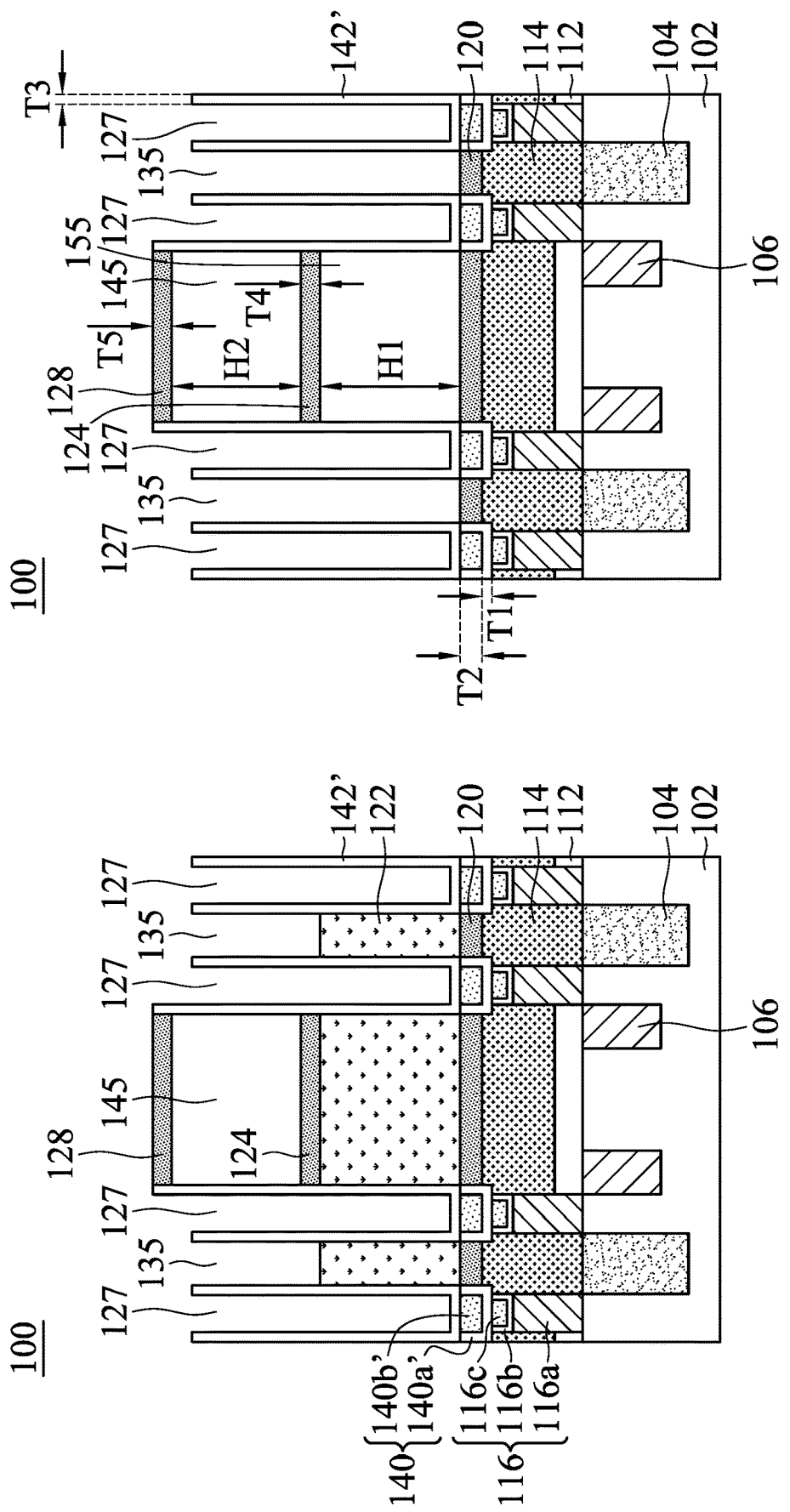

MEMORY DEVICE AND METHOD FOR MANUFACTURING THE SAME

CROSS REFERENCE TO RELATED APPLICATIONS

This Application claims priority of Taiwan Patent Application No. 107128604, filed on Aug. 16, 2018, the entirety of which is incorporated by reference herein.

BACKGROUND

Field of the Disclosure

The present disclosure relates to a memory device, and in particular relates to a memory device having a capacitor structure and a method for manufacturing the memory device.

Description of the Related Art

Dynamic random access memory (DRAM) has the advantages of small size, large memory capacity, fast reading and writing speeds, and long product life, so it is widely used in various electronic products.

In the conventional method of manufacturing a DRAM, a capacitor structure is formed in a plurality of holes of a multilayer insulating structure. In the subsequent process of removing the multilayer insulating structure, the bottom of the capacitor structure may be damaged easily, so that the subsequent etching solution may easily penetrate into the underlying interlayer insulating layer or the conductive contact plug via the damaged capacitor structure. As a result, the interlayer insulating layer, the conductive contact plug, and even the lower components in the substrate are damaged, thereby greatly reducing the yield of the memory device.

In order to solve the above problem, the thickness of the bottom electrode of the capacitor structure may be increased. However, the bottom electrode has a cup shape. As the bottom electrode becomes thicker, the sidewall thereof becomes thicker, and the inner diameter thereof is reduced. Therefore, the contact surface area of the bottom electrode and the dielectric layer disposed on the bottom electrode becomes smaller. As a result, the capacitance value of the capacitor structure is reduced, and the performance of the memory device is reduced. Furthermore, such a solution is difficult to reduce the critical dimension, which is disadvantageous to the miniaturization of the memory device.

With the trend toward the miniaturization of electronic products, there is also demand for the miniaturization of memory devices. However, with the miniaturization of memory devices, it has become more difficult to increase the yield of the products. Therefore, there is still a need for a memory device having a high yield and a method of manufacturing the same.

BRIEF SUMMARY

The disclosure provides a memory device. The memory device includes an interlayer insulating layer formed on a substrate, a conductive contact plug formed in the interlayer insulating layer, and a conductive barrier structure formed on the conductive contact plug. An area of a top surface of the conductive contact plug is smaller than an area of a bottom surface of the conductive barrier structure, and the top surface of the conductive contact plug is completely covered by the bottom surface of the conductive barrier structure. The memory device also includes a capacitor structure formed on the conductive barrier structure. The capacitor structure includes a first electrode layer formed on the conductive barrier structure, a dielectric layer formed on the first electrode layer, and a second electrode layer formed on the dielectric layer. The first electrode layer defines a first recessed region.

The disclosure also provides a method for manufacturing a memory device. The method includes forming an interlayer insulating layer on a substrate, forming a conductive contact plug in the interlayer insulating layer, forming a multilayer insulating structure on the interlayer insulating layer, and forming a hole in the multilayer insulating structure. The hole exposes the conductive contact plug. The method also includes forming a conductive barrier structure on a bottom of the hole. An area of a top surface the of conductive contact plug is smaller than an area of a bottom surface of the conductive barrier structure, and the top surface of the conductive contact plug is completely covered by the bottom surface of the conductive barrier structure. The method also includes conformally forming a first electrode layer on the multilayer insulating structure and the conductive barrier structure. The first electrode layer defines a recessed region. The method also includes removing the multilayer insulating structure, forming a dielectric layer on the first electrode layer, and forming a second electrode layer on the dielectric layer.

BRIEF DESCRIPTION OF THE DRAWINGS

For a more complete understanding of the present disclosure, and the advantages thereof, reference is now made to the following descriptions taken in conjunction with the accompanying drawings, in which:

FIGS. 1-9 show cross-sectional views showing various steps of manufacturing a memory device in accordance with some embodiments; and FIG. 10 shows a cross-sectional view of a memory device in accordance with other embodiments.

DETAILED DESCRIPTION

Figures 3, 4:
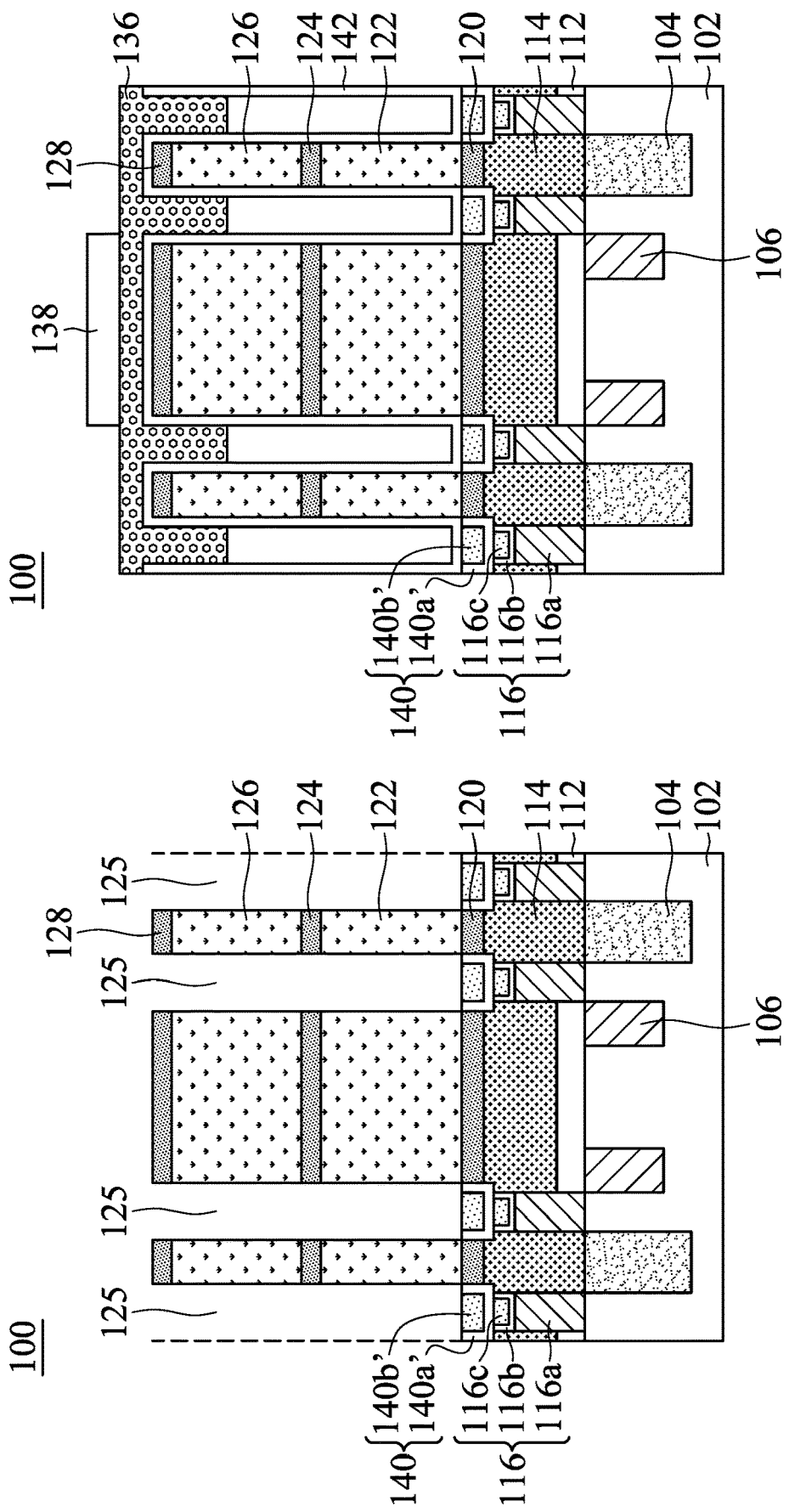

The present disclosure is best understood from the following detailed description when read with the accompanying figures. It should be noted that, in accordance with the standard practice in the industry, various features are not drawn to scale. In fact, the relative dimensions of the various features may be arbitrarily increased or reduced for clarity of discussion. In addition, the present disclosure may repeat reference numerals and/or letters in the various examples. This repetition is for the purpose of simplicity and clarity and does not in itself dictate a relationship between the various embodiments and/or configurations discussed.

In the disclosure, the term "about" or "approximately" means in a range of 20% of a given value or range, preferably 10%, and more preferably 5%. In the disclosure, if there is no specific explanation, a given value or range means an approximate value which may imply the meaning of "about" or "approximately".

FIGS. 1-9 show cross-sectional views showing various steps of manufacturing a memory device 100 in accordance with some embodiments.

Referring to FIG. 1, an interlayer insulating layer is formed on a substrate 102, and the interlayer insulating layer is patterned to form a plurality of openings which exposes the substrate 102. A plurality of conductive contact plugs 116 are formed in the openings. The material of the substrate 102 may include silicon, silicon-containing semiconductor, silicon on insulator (SOI), other suitable materials, or a combination thereof. In this embodiment, the material of the substrate 102 is silicon. Various components may be included in the substrate 102, such as the isolation structure 104, the buried word line 106, and other components (not shown). For example, the material of the isolation structure 104 may be silicon oxide, and the material of the buried word line 106 may be metal or an alloy. The interlayer insulating layer may be a single layer structure or a multi-layer structure. In some embodiments, the interlayer insulating layer is a single layer structure and is formed by nitride. In other embodiments, the interlayer insulating layer is a dual-layer structure and includes the first sub-layer 112 and the second sub-layer 114 formed on the first sub-layer 112. In this embodiment, the first sub-layer 112 is formed by oxide and the second sub-layer 114 is formed by nitride. By forming the uppermost layer of the interlayer insulating layer with nitride, during the subsequent wet etching process (i.e., the fourth etching process), the amount of the etching solution penetrating into the substrate 102 can be reduced. Therefore, it is advantageous for improving the yield of the memory device 100.

In this embodiment, the conductive contact plug 116 includes the first conductive element 116a, the conductive liner 116b, and the second conductive element 116c. The steps of forming the conductive contact plug 116 includes: depositing the conductive material in the openings, and adjusting the thickness of the conductive material by etching back process to form the first conductive element 116a; conformally depositing the conductive liner 116b in the openings; and forming the second conductive element 116c on the conductive liner 116b. The first conductive element 116a may include a non-metallic conductive material, such as doped or undoped monocrystalline silicon or polycrystalline silicon. The second conductive element 116c may include a metallic conductive material, such as tungsten, aluminum, copper, gold, silver, an alloy thereof, or other suitable metallic materials. The conductive liner 116b may include a conductive metal compound, such as titanium nitride or tantalum nitride.

In this embodiment, the first conductive element 116a includes a non-metallic conductive material, so that the electrical interference between the conductive contact plug 116 and the conductive components (for example, the buried word line 106) in the substrate 102 may be prevented. The second conductive element 116c includes a metallic conductive material, so that the penetration of the subsequent etching solution into the substrate 102 may be prevented. Therefore, the yield of the memory device 100 may be improved. In addition, the conductive liner 116b can improve the adhesion between the first conductive element 116a and the second conductive element 116c, and can avoid a sudden change in the electrical resistance value.

Then, a multilayer insulating structure is formed on the interlayer insulating layer, and the multilayer insulating structure is patterned to form a plurality of holes 115 exposing the conductive contact plugs 116. The bottom surface of each of the holes 115 is larger than the top surface of the conductive contact plug 116. In this embodiment, the multilayer insulating structure includes the first insulating layer 120, the second insulating layer 122, the third insulating layer 124, the fourth insulating layer 126, and the fifth insulating layer 128 sequentially formed on the interlayer insulating layer. The material for forming the multilayer insulating structure may include oxide, nitride, oxynitride, or a combination thereof.

In this embodiment, the multilayer insulating structure is formed by two different materials that are disposed alternately. More specifically, the first insulating layer 120, the third insulating layer 124, and the fifth insulating layer 128 are formed by the first insulating material, and the second insulating layer 122 and the fourth insulating layer 126 are formed by the second insulating material. Furthermore, in subsequent etching processes (for example, the second etching process, the third etching process, and the fourth etching process), the first insulating material and the second insulating material may have high etch selectivity. In this embodiment, the first insulating material is nitride, and the second insulating material is oxide.

Then, the first barrier material 140a is conformally deposited on the multilayer insulating structure and the conductive contact plug 116, so that the first barrier material 140a covers the bottoms and the sidewalls of the holes 115. The first barrier material 140a may be a material having good adhesion to the first insulating layer 120, thereby preventing the subsequent etching solution from penetrating into the underlying layers along the gap between the first barrier material 140a and the first insulating layer 120. In some embodiments, the first barrier material 140a is titanium (Ti), titanium nitride (TiN), tungsten nitride (WN), tantalum (Ta), or tantalum nitride (TaN).

Referring to FIG. 2, the second barrier material 140b is deposited on the first barrier material 140a, so that the second barrier material 140b fills the holes 115. Then, a planarization process (for example, a chemical mechanical polishing process) may be optionally performed to remove the second barrier material 140b on the multilayer insulating structure. In some embodiments, the second barrier material 140b is a metal material having good electrical conductivity, such as tungsten (W) or copper (Cu), to provide a lower electrical resistance value. Therefore, the performance of the memory device 100 can be improved.

Then, an etching back process is performed to partially remove a portion of the first barrier material 140a and a portion of the second barrier material 140b, thereby forming conductive barrier structures 140 and holes 125 exposing the conductive barrier structures 140. Each conductive barrier structure 140 includes the first barrier layer 140a' and the second barrier layer 140b'. The first barrier layer 140a' includes the first barrier material 140a formed on the conductive contact plug 116 and defines a recessed region. The second barrier layer 140b' includes the second barrier material 140b formed on the first barrier layer 140a' and fills up the recessed region. Because the multilayer insulating structure is not affected by the etching back process, the area of the bottom surface of the conductive barrier structure 140 is larger than the area of the top surface of the conductive contact plug 116, and the top surface of the conductive contact plug 116 is completely covered by the bottom surface of the conductive barrier structure 140.

It should be understood that the left sidewall of the leftmost hole 125 and the right sidewall of the rightmost hole 125 are indicated by dotted lines to represent the omitted part of the multilayer insulating structure in FIG. 3.

Referring to FIG. 4, the first electrode material 142 is conformally formed on multilayer insulating structure and the conductive barrier structure 140. Then, the sacrificial layer 136 is formed on the first electrode material 142 to seal the openings of the holes 125 and to cover the multilayer insulating structure. The sacrificial layer 136 is only filled in the upper portion of the holes 125, so that the lower portion of the holes 125 has a hollow structure. In some embodiments, the sacrificial layer 136 is oxide. The sacrificial layer 136 may be formed by a method with poor hole filling ability, for example, a high-density plasma chemical vapor deposition (HDP-CVD) process. Then, the patterned mask layer 138 is disposed on the sacrificial layer 136. In some embodiments, the mask layer is photoresist.

The first electrode material 142 can be easily adhered to the first barrier layer 140a' to prevent the subsequent etching solution from penetrating into the underlying interlayer insulating layer and the substrate 102 along the gap between the first electrode material 142 and the first barrier layer 140a'. Furthermore, the first electrode material 142 can be easily adhered to the third insulating layer 124, so that the first electrode material 142 can be supported. In some embodiments, the first electrode material 142 is titanium, titanium nitride, tungsten nitride, tantalum or tantalum nitride. In this embodiment, both the first electrode material 142 and the first barrier material 140a are titanium nitride, so that the adhesion between them is good, and the complexity of the process can be reduced. In other embodiments, in order to increase the flexibility of the process, the first electrode material 142 is different from the first barrier material 140a.

Figures 5, 6:
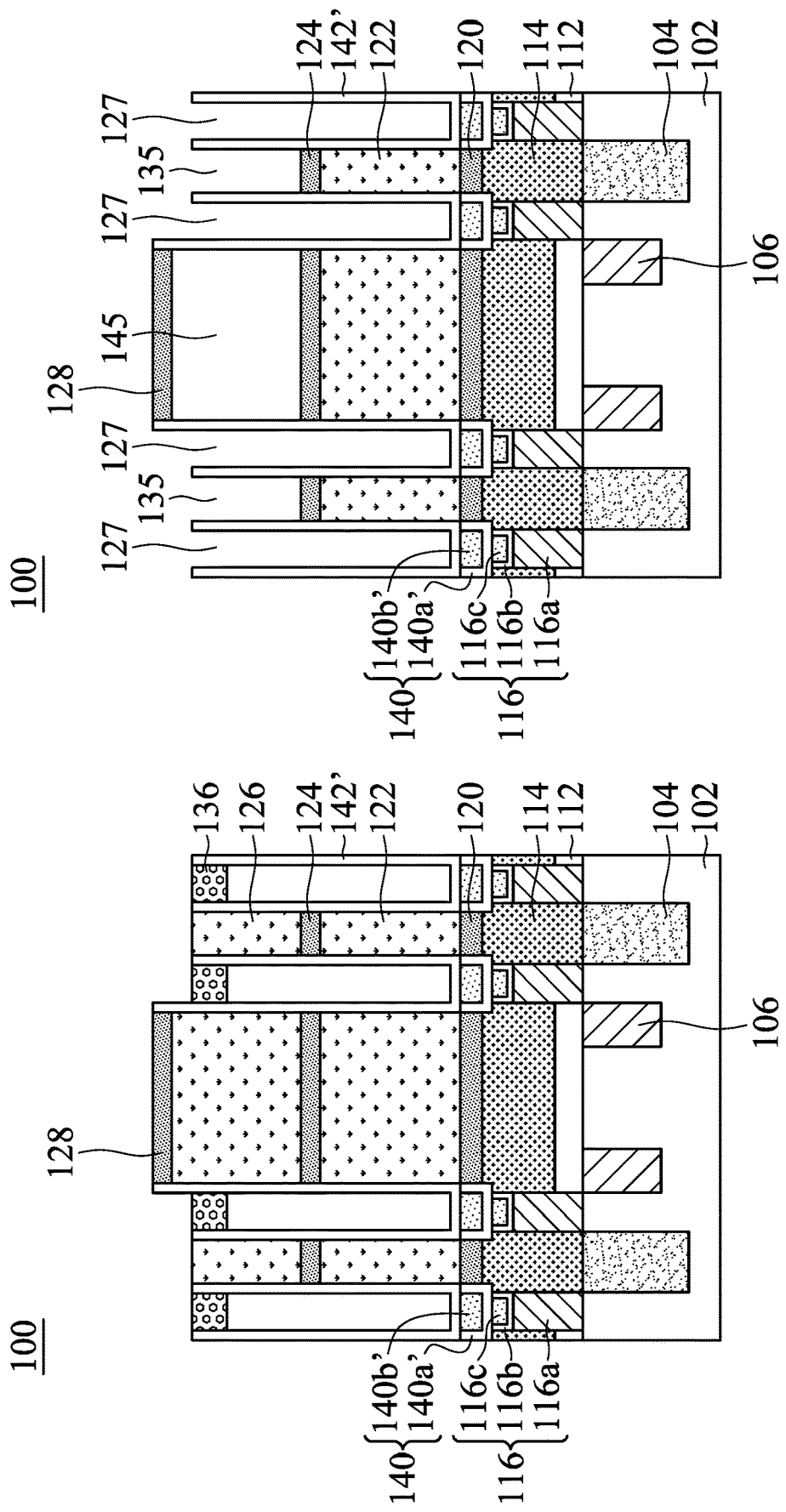

Referring to FIG. 5, a first etching process is performed to remove the patterned mask layer 138, a portion of the sacrificial layer 136, a portion of the first electrode material 142, and a portion of the fifth insulating layer 128. The fifth insulating layer 128 under the patterned mask layer 138 is not removed. The fifth insulating layer 128 which is not covered by the patterned mask layer 138 is removed to expose the underlying fourth insulating layer 126, and a plurality of separated first electrode layers 142' are formed. Each first electrode layer 142' has a cup shape and has a U-shaped cross-sectional profile, and its opening is sealed by the sacrificial layer 136. The enclosed spaces located in the first electrode layers 142' are separated. The multilayer insulating structure located between the first electrode layers 142' is continuous (in a direction which is not shown).

Referring to FIG. 6, a second etching process is performed to remove the sacrificial layer 136 and the fourth insulating layer 126 and to expose the third insulating layer 124. The second etching process is a wet etching process. Because the multilayer insulating structure located between the first electrode layers 142' is continuous, the etching solution used in the second etching process can remove the fourth insulating layer 126 located between the first electrode layers 142'. Furthermore, during the second etching process, both the etching rate of third insulating layer 124 and the etching rate of the fifth insulating layer 128 are much smaller than the etching rate of the fourth insulating layer 126. Therefore, only the fourth insulating layer 126 can be removed without removing the third insulating layer 124 and the fifth insulating layer 128. After the second etching process, the first electrode layers 142' define the recessed regions 127, and the recessed regions 135 and the hollow regions 145 exist between the first electrode layers 142'. The positions of the recessed regions 127 respectively correspond to the positions of the holes 125.

Referring to FIG. 7, a third etching process is performed to remove the third insulating layer 124 at the bottom of the recessed region 135 and to expose the underlying second insulating layer 122. The third etching process is a dry etching process.

Referring to FIG. 8, a fourth etching process is performed to remove the second insulating layer 122. The fourth etching process is a wet etching process. The etching rate of the third insulating layer 124 and the etching rate of the conductive barrier structure 140 are much smaller than the etching rate of the second insulating layer 122. Therefore, only the second insulating layer 122 can be removed without removing the third insulating layer 124 and the conductive barrier structure 140. After the fourth etching process, the hollow region 155 is formed below the hollow region 145, and the third insulating layer 124 is located between the hollow region 155 and the hollow region 145.

Figures 9, 10:
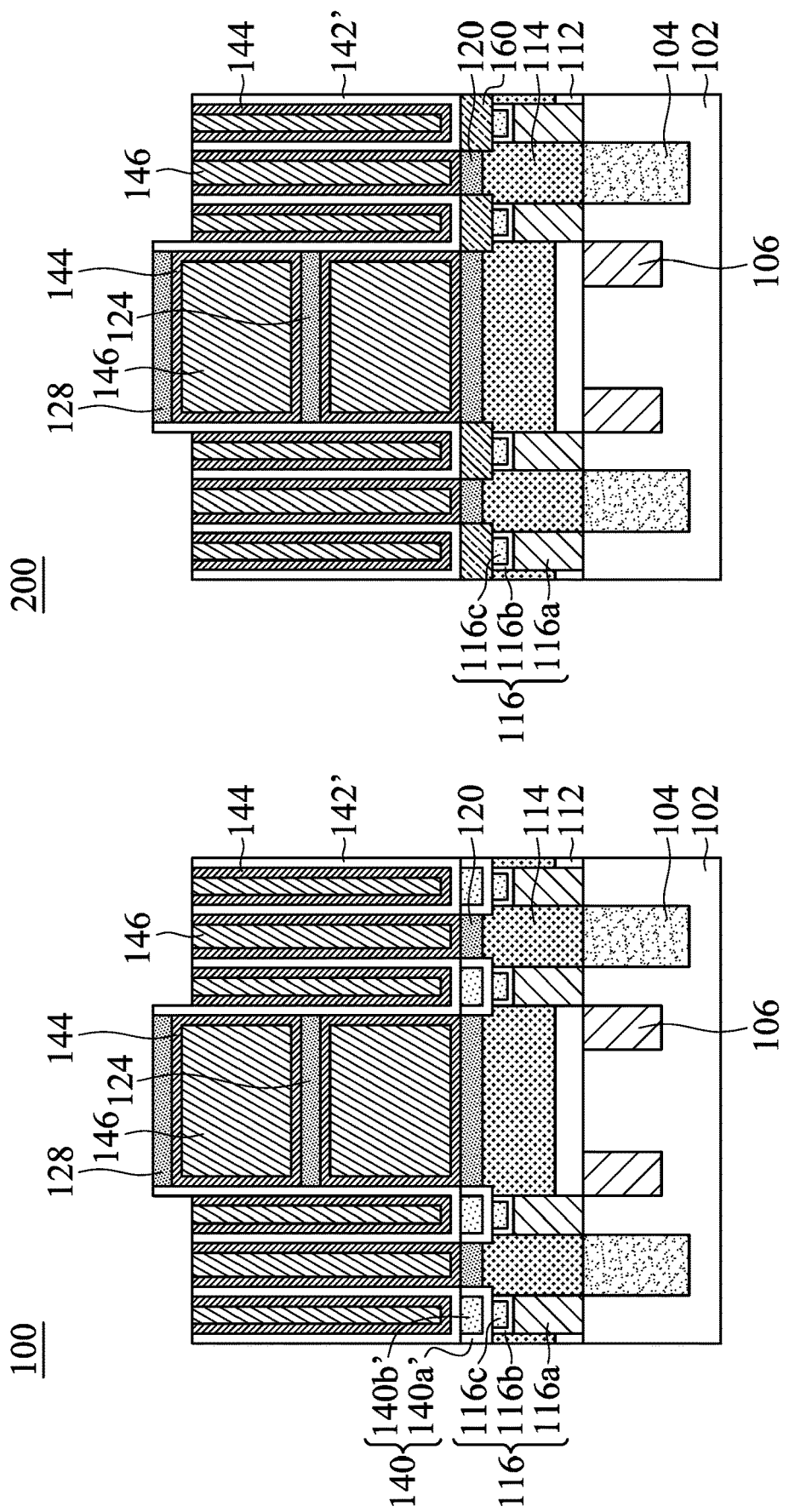

Referring to FIG. 9, after removing the multilayer insulating structure, a dielectric layer 144 is conformally deposited on the first electrode layer 142'. Then, a second electrode layer 146 is deposited on the dielectric layer 144. Since the recessed regions 135 and the hollow regions 145, 155 are connected to one another, the dielectric layer 144 will conformally grow on the inner sidewalls of the recessed regions 127, 135 and the hollow regions 145, 155, and the second electrode layer 146 will fill the remaining portions of the recessed regions 127, 135 and the hollow regions 145, 155. In the present specification, the first electrode layer 142', the dielectric layer 144, and the second electrode layer 146 are collectively referred to as a "capacitor structure". The dielectric layer 144 may be formed by a suitable high-k material. In some embodiments, the dielectric layer 144 is silicon nitride ($Si_3N_4$), aluminum oxide ($Al_2O_3$), yttrium oxide ($Y_2O_3$), titanium oxide (TiO), hafnium oxide ($HfO_2$), or zirconium dioxide ($ZrO_2$). The second electrode layer 146 may be formed by a material having good conductivity. Therefore, the performance of the memory device 100 can be improved. In some embodiments, the material of the second electrode layer 146 is silicon germanium (SiGe). In some embodiments, the second electrode layer 146 may include a first conductive sub-layer and a second conductive sub-layer. The first conductive sub-layer is conformally formed on the dielectric layer 144, and the second conductive sub-layer is filled the remaining spaces of the recessed regions 127, 135 and the hollow regions 145, 155 after forming the first conductive sub-layer. In other words, the first conductive sub-layer is disposed between the second conductive sub-layer and the dielectric layer 144. The material of the first conductive sub-layer is, for example, titanium, titanium nitride, tungsten nitride, tantalum or tantalum nitride. The material of the second conductive sub-layer is, for example, silicon germanium. Therefore, the leakage current can be reduced.

When observed from the top view, the capacitor structure is a concentric multilayer structure. In some embodiments, the first electrode layer 142', the dielectric layer 144, and the second electrode layer 146 forms a double-sided capacitor structure. That is, from the center of the recessed region 127, the double-sided capacitor structure sequentially includes the second electrode layer 146, the dielectric layer 144, the first electrode layer 142', the dielectric layer 144, and the second electrode layer 146. Therefore, the resulting capacitor structure is a five-layer structure formed by the conductor layer/insulation layer/conductor layer/insulation layer/conductor layer. By comparison, the so-called "single-sided capacitor structure" refers to a three-layer structure only formed by the conductor layer/insulation layer/conductor layer. For the capacitor structures occupying the same substrate area, the capacitance value of the double-sided capacitor structure of this embodiment may be twice the capacitance value of the single-sided capacitor structure. Therefore, the critical dimension of the memory device 100 can be reduced, and the performance of the memory device 100 can be improved.

In this embodiment, when observed from the top view, the capacitor structure is circular. In other embodiments, when observed from the top view, the capacitor structure may be a regular polygon (for example, a square or a regular hexagon) or an irregular polygon. After the capacitor structure is formed, other conventional processes may be performed to complete the memory device 100. In order to simplify the description, other conventional processes are not described in detail here.

With the conductive barrier structure 140 in this embodiment, even if the bottom of the first electrode layer 142' is damaged during the third etching process, the etching solution used in the fourth etching process is still blocked by the conductive barrier structure 140 and it is difficult for the etching solution to penetrate into conductive contact plug 116. Furthermore, because the top surface of the conductive contact plug 116 is completely covered by the bottom surface of the conductive barrier structure 140, the etching solution is blocked by the conductive barrier structure 140 without penetrating into the interface between the second sub-layer 114 and the second conductive element 116c. In addition, because of the good adhesion of the first barrier layer 140a' to the first insulating layer 120, the etching solution can be prevented from penetrating into the substrate 102 along the interface between the first barrier layer 140a' and the first insulating layer 120.

As described above, by forming the conductive barrier structure 140 between the first electrode layer 142' and the conductive contact plug 116, the penetration of the etching solution into the substrate 102 can be significantly reduced or completely prevented. As a result, the yield of the memory device 100 can be significantly improved. On the other hand, in this embodiment, even if the thickness of the first electrode material 142 is not increased, the yield of the memory device 100 can still be significantly improved. Therefore, the memory device 100 can have better performance and a smaller critical dimension.

Please refer to FIGS. 7 and 8, in order to make the conductive barrier structure 140 have a better barrier effect and to make the memory device 100 have better performance, in the direction which is perpendicular to the top surface of the substrate 102, the bottom of the first barrier layer 140a' has a first thickness T1, and the second barrier layer 140b' has a second thickness T2. In some embodiments, the total thickness of the conductive barrier structure 140 (i.e., T1+T2) is 5-40 nm. In other embodiments, the total thickness of the conductive barrier structure 140 is 10-20 nm.

Referring to FIGS. 8 and 9, in order to increase the capacitance value of the capacitor structure, the contact area between the first electrode layer 142' and the dielectric layer 144 may be increased. However, with the miniaturization of the memory device 100, the area of the bottom surface of the recessed region 127 becomes smaller and smaller. Therefore, the contact area of the first electrode layer 142' and the dielectric layer 144 may be increased by increasing the height of the first electrode layer 142' (i.e., increasing the aspect ratio of the recessed region 127). The aspect ratio of the recessed region 127 depends on the aspect ratio of the hole 115 (shown in FIG. 1). In some embodiments, the aspect ratio of the holes 115 is 20-80. In other embodiments, the aspect ratio of the holes 115 is 50-60.

Referring to FIG. 8, after removing the second insulating layer 122, a plurality of separated first electrode layers 142' having a cup-like structure are arranged in an array on the substrate 102. As described above, the cup-like structure of the first electrode layer 142' has a high aspect ratio. If the thickness of the sidewall of the first electrode layer 142' is insufficient, one first electrode layer 142' may collapse and physically contact with the adjacent first electrode layer 142', thereby being short together. As a result, the yield of the memory device 100 may be reduced. In this embodiment, a portion of the third insulating layer 124 and a portion of the fifth insulating layer 128 are retained at specific locations, as shown in FIG. 8. The remaining third insulating layer 124 and the fifth insulating layer 128 can provide sufficient support for the first electrode layers 142'. Therefore, the problem of collapse of the first electrode layers 142' described above can be solved, and the yield of the memory device 100 can be significantly improved.

In order to provide better support for the first electrode layer 142' and to reduce the risk of cracking or hole breaking of the conductive barrier structure 140 more effectively, in some embodiments, the thickness T4 of the third insulating layer 124 is 10-50 nm, and the thickness T5 of the fifth insulating layer 128 is 50-300 nm.

In order to provide a better support effect, the third insulating layer 124 may be located at a position of 30-60% of the height of the first electrode layer 142'. In other words, the ratio (H1/H2) of the height H1 of the hollow region 155 to the height H2 of the hollow region 145 may be 0.4-1.5.

In order to make the first electrode layer 142' less likely to collapse and to make the capacitor structure have a better capacitance value, the thickness of the sidewalls of the first electrode layer 142' may be adjusted. Referring to FIG. 8, in some embodiments, the thickness T3 of the sidewall of the first electrode layer 142' is 5-40 nm. In other embodiments, this thickness T3 is 10-30 nm.

In order to make the surface of the conductive barrier structure 140 relatively flat and to improve the yield and the critical dimension of the memory device 100, the selectivity of the etching back process may be adjusted. In some embodiments, during the etching back process shown in FIG. 3, the ratio (R1/R2) of the etching rate R1 of the first barrier material 140a to the etching rate R2 of the second barrier material 140b is 0.8-1.2. In other embodiments, during the etching back process shown in FIG. 3, the etching rate R1 of the first barrier material 140a is substantially equal to the etching rate R2 of the second barrier material 140b.

In order to make the conductive barrier structure 140 have better barrier ability, during the third etching process shown in FIG. 7, the etching rate of the conductive barrier structure 140 may be reduced. In some embodiments, during the third etching process, the ratio (R3/R4) of the etching rate R3 of the third insulating layer 124 to the etching rate R4 of the conductive barrier structure 140 is 50-100. Similarly, during the fourth etching process shown in FIG. 8, the etching rate of the conductive barrier structure 140 may be reduced. In some embodiments, during the fourth etching process, the ratio (R5/R6) of the etching rate of the second insulating layer 122 to the etching rate R6 of the conductive barrier structure 140 is 50-100.

In some embodiments of the present invention, a memory device is provided. Referring to FIG. 9, the memory device 100 of the present invention includes the interlayer insulating layer formed on the substrate 102, the conductive contact plug 116 formed in the interlayer insulating layer, the conductive barrier structure 140 formed on the conductive contact plug 116, and the capacitor structure formed on the conductive barrier structure 140. In some embodiments, the interlayer insulating layer includes the first sub-layer 112 and the second sub-layer 114. In some embodiments, the conductive contact plug 116 includes the first conductive element 116a, the conductive liner 116b, and the second conductive element 116c. In some embodiments, the conductive barrier structure 140 includes the first barrier layer 140a' and the second barrier layer 140b'. The first barrier layer 140a' is formed on the conductive contact plug 116 and has a U-shaped cross-sectional profile to define a recessed region (i.e., the region surrounded by the first barrier layer 140a' in FIG. 9). The second barrier layer 140b' is formed on the first barrier layer 140a' and fills the recessed region defined by the first barrier layer 140a'. The area of the top surface of the conductive contact plug 116 is smaller than the area of the bottom surface of the conductive barrier structure 140, and the top surface of the conductive contact plug 116 is completely covered by the bottom surface of the conductive barrier structure 140.

In some embodiments, the capacitor structure is a double-sided capacitor formed by the first electrode layer 142', the dielectric layer 144, and the second electrode layer 146. In some embodiments, the first electrode layer 142' is formed on the conductive barrier structure 140. The first electrode layer 142' has a U-shaped cross-sectional profile and defines a recessed region 127 (shown in FIG. 8). As shown in FIG. 9, the depth of the recessed region defined by the first electrode layer 142' is greater than the depth of the recessed region defined by the first barrier layer 140a'.

As described above, for the memory device 100 illustrated in FIG. 9, the penetration of the etching solution and the collapse of the first electrode layer 142' can be reduced or avoided. Therefore, the yield and performance of the memory device 100 can be significantly improved, and it is advantageous to the miniaturization of the memory device 100.

FIG. 10 shows a cross-sectional view of a memory device 200 in accordance with other embodiments. FIG. 10 is similar to FIG. 9, and the difference is that the conductive barrier structure 160 shown in FIG. 10 is formed by a single material. The same elements in FIG. 10 and FIG. 9 are denoted by the same reference numerals. For the sake of simplicity of explanation, the elements and their formation method which are the same as those in FIG. 9 are not repeated here.

In some embodiments, a material which has good adhesion to the first insulating layer 120, good conductivity, and can block the penetration of the etching solution may be selected to form the conductive barrier structure 160. In such an embodiment, by forming the conductive barrier structure 160 in a single step, production time and cost may be lowered, and the complexity of the process may be reduced. Furthermore, after the etching back process, the conductive barrier structure 160 may have a substantially flat top surface. It is advantageous for improving the yield and the critical dimension of the memory device 100. In some embodiments, the material of the conductive barrier structure 160 is tungsten or copper.

In some embodiments, after forming the holes 115 (shown in FIG. 1), the holes 115 are filled with a conductive barrier material. Next, an etching back process as shown in FIG. 3 is performed to selectively remove a portion of the conductive barrier material, and the conductive barrier structure 160 is formed. By using this etching back process, the thickness of the conductive barrier structure 160 can be adjusted to a desired range. As a result, the yield of the memory device 100 can be improved, and it is advantageous to the miniaturization of the memory device 100. In some embodiments, the thickness of the conductive barrier structure is 5-40 nm. In other embodiments, the thickness of the conductive barrier structure is 10-20 nm.

In conclusion, some embodiments of the present invention provide a memory device with improved yield and critical dimension. Furthermore, some embodiments of the present invention provide a manufacturing method that can be used to form a memory device with improved yield and critical dimension. The manufacturing method can be easily integrated into an existing memory device process without the need of substantial modification or replacement of production equipment. Therefore, the yield and the critical dimension of the memory device can be effectively improved without increasing the complexity of the process and the production cost.

Although the disclosure has been described by way of example and in terms of the preferred embodiments, it should be understood that various modifications and similar arrangements (as would be apparent to those skilled in the art) can be made herein without departing from the spirit and scope of the disclosure as defined by the appended claims.

What is claimed is:
1. A memory device, comprising:
an interlayer insulating layer formed on a substrate;
a conductive contact plug formed in the interlayer insulating layer;
a conductive barrier structure formed on the conductive contact plug, wherein an area of a top surface of the conductive contact plug is smaller than an area of a bottom surface of the conductive barrier structure, and the top surface of the conductive contact plug is completely covered by the bottom surface of the conductive barrier structure; and
a capacitor structure formed on the conductive barrier structure, wherein the capacitor structure comprises:
a first electrode layer formed on the conductive barrier structure,
wherein the first electrode layer defines a first recessed region;
a dielectric layer formed on the first electrode layer; and
a second electrode layer formed on the dielectric layer;
wherein the conductive barrier structure comprises:
a first barrier layer formed on the conductive contact plug, wherein the first barrier layer defines a second recessed region; and
a second barrier layer formed on the first barrier layer and filling the second recessed region, wherein a material of the second barrier layer is different from a material of the first barrier layer.

2. The memory device as claimed in claim 1, wherein the material of the first barrier layer is titanium, titanium nitride, tungsten nitride, tantalum or tantalum nitride.

3. The memory device as claimed in claim 1, wherein a total thickness of the conductive barrier structure is 5-40 nm.

4. The memory device as claimed in claim 1, wherein a depth of the first recessed region is greater than a depth of the second recessed region.

5. The memory device as claimed in claim 1, wherein a thickness of a sidewall of the first electrode layer is 5-40 nm.

6. A method for manufacturing a memory device, comprising:
forming an interlayer insulating layer on a substrate;
forming a conductive contact plug in the interlayer insulating layer;
forming a multilayer insulating structure on the interlayer insulating layer;
forming a hole in the multilayer insulating structure to expose the conductive contact plug;

forming a conductive barrier structure on a bottom of the hole, wherein an area of a top surface the of conductive contact plug is smaller than an area of a bottom surface of the conductive barrier structure, and the top surface of the conductive contact plug is completely covered by the bottom surface of the conductive barrier structure;

conformally forming a first electrode layer on the multilayer insulating structure and the conductive barrier structure, wherein the first electrode layer defines a recessed region;

removing the multilayer insulating structure;

forming a dielectric layer on the first electrode layer; and forming a second electrode layer on the dielectric layer.

7. The method for manufacturing the memory device as claimed in claim 6, wherein forming the conductive barrier structure on the bottom of the hole comprises:

filling the hole with a conductive barrier material; and removing a portion of the conductive barrier material.

8. The method for manufacturing the memory device as claimed in claim 6, wherein forming the conductive barrier structure on the bottom of the hole comprises:

conformally depositing a first conductive barrier material on the multilayer insulating structure and the conductive contact plug;

filling the hole with a second conductive barrier material, wherein the second conductive barrier material is different from the first conductive barrier material; and performing an etching back process to remove a portion of the first conductive barrier material and the second conductive barrier material.

9. The method for manufacturing the memory device as claimed in claim 6, wherein an aspect ratio of the hole is 20-80.

10. The method for manufacturing the memory device as claimed in claim 6, wherein the multilayer insulating structure comprises:

a first insulating layer formed on the interlayer insulating layer;

a second insulating layer formed on the first insulating layer;

a third insulating layer formed on the second insulating layer;

a fourth insulating layer formed on the third insulating layer; and a fifth insulating layer formed on the fourth insulating layer, wherein the first insulating layer, the third insulating layer, and the fifth insulating layer is formed by a first insulating material, and the second insulating layer and the fourth insulating layer is formed by a second insulating material.

11. The method for manufacturing the memory device as claimed in claim 8, wherein during the etching back process, a ratio of the etching rate of the first conductive barrier material to the etching rate of the second conductive barrier material is 0.8-1.2.

12. The method for manufacturing the memory device as claimed in claim 10, wherein a thickness of the third insulating layer is 10-50 nm.

13. The method for manufacturing the memory device as claimed in claim 10, wherein removing the multilayer insulating structure comprises:

performing a first wet etching process to remove the fourth insulating layer and to expose the third insulating layer;

performing a dry etching process to remove a portion of the third insulating layer; and performing a second wet etching process to remove the second insulating layer.

14. The method for manufacturing the memory device as claimed in claim 13, wherein during the dry etching process, a ratio of the etching rate of the third insulating layer to the etching rate of the conductive barrier structure is 50-100.

15. The method for manufacturing the memory device as claimed in claim 13, wherein during the second wet etching process, a ratio of the etching rate of the second insulating layer to the etching rate of the conductive barrier structure is 50-100.

* * * * *